United States Patent

Gallagher

[11] Patent Number: 5,841,292
[45] Date of Patent: Nov. 24, 1998

[54] AUTOMATED TEST PIN LOADING APPARATUS

[75] Inventor: Robert J. Gallagher, Nashua, N.H.

[73] Assignee: Star Technology Group, Inc., Nashua, N.H.

[21] Appl. No.: 811,543

[22] Filed: Mar. 4, 1997

[51] Int. Cl.⁶ .................................................. G01R 31/02
[52] U.S. Cl. ............................................. 324/761; 193/44
[58] Field of Search ......................... 29/705; 193/44; 324/754, 758, 761; 414/754

[56] References Cited

U.S. PATENT DOCUMENTS

| | | | |
|---|---|---|---|
| 3,924,325 | 12/1975 | Kufner | 29/626 |
| 4,266,191 | 5/1981 | Spano et al. | |
| 4,564,110 | 1/1986 | Kasprzyk | 193/44 X |
| 4,736,522 | 4/1988 | Larson | 29/842 |
| 4,829,241 | 5/1989 | Maelzer | 324/758 X |
| 5,277,066 | 1/1994 | Marshall | 73/663 |
| 5,307,560 | 5/1994 | Aksu | 29/842 |
| 5,453,702 | 9/1995 | Creeden | 324/761 |
| 5,511,304 | 4/1996 | Aksu | 29/705 |
| 5,594,177 | 1/1997 | Hanse | 73/663 |
| 5,614,819 | 3/1997 | Nucci | 324/758 X |

*Primary Examiner*—Janice L. Krizek
*Attorney, Agent, or Firm*—Hayes, Soloway, Hennessey, Grossman & Hage, P.C.

[57] ABSTRACT

Apparatus for loading test pins into a test fixture of the type having a plurality of holes containing test pins. A shaker table supports the fixture to be loaded together with a pin cassette containing a plurality of pins with their bottom ends resting on the fixture. A funnel or chute is located below the shaker table to catch spare pins and direct the pins into a collection container or drawer which has one or more angled internal baffle walls for orienting the pins in the same direction.

6 Claims, 5 Drawing Sheets

AUTOMATED TEST PIN LOADING APPARATUS

BACKGROUND OF THE INVENTION

1. Field of the Invention

This invention relates to an apparatus for loading of test pins in a probe head (or fixture) useful in automated testing of circuit boards.

2. Brief Statement of the Prior Art

The automated testing of printed circuit boards to detect manufacturing flaws and defects is commonly performed with a mechanical press with one or two test fixtures resting on the platens of the press. The test fixtures have many spring pins which are located at preselected points for testing of a printed circuit board with the most common pin-to-pin spacing being 0.1, 0.07 or 0.05 inch. The plates for the test fixtures are usually predrilled with a grid-like distribution of holes at the aforementioned uniform spacings.

Printed circuit board manufacturing capability has advanced to very compact configurations, particularly with surface mounted components such as integrated circuits. These surface mounted components are mounted with connections which are at closer spacings than the 0.05 inch, pin-to-pin distances which are the closest that can be practically provided with a grid distribution of holes for test pins. Accordingly, there is an increasing demand for adapters which translate the geometrically uniform grid locations of spring test pins to off-grid locations. Fixtures, which comprise a plurality of thin wire pins or probes supported by two or more insulating plates separated by spacers, have been used as adapters for this purpose.

A typical fixture comprises two or more insulating plates separated by spacers. The plate of the fixture which is placed on the test head of the tester has holes which are located "on-grid", i.e. at the geometrical regular spacings corresponding to the grid of the test head. The plate which will be adjacent the printed circuit board under test, has holes which are located at the precise test point locations of the circuit board under test, a number of which may be "off-grid", i.e. may not be at the precise location of a test pin in the test head. The test pins, which typically are straight lengths of stiff wire, e.g. piano wire, are manually loaded into the plates and, when the particular test point served by a pin is off-grid, the pin is canted at a slight angle to extend from the on-grid hole in the plate next to the test head to the off-grid hole in the fixture which is next to the printed circuit board. Frequently, one or more additional insulating guide plates are positioned at intermediate levels between the upper and lower plates of the fixture and holes for the pins are drilled to align with the holes in the upper and lower plates. Such guide plates allow a pin once inserted to fall into the fixture properly aligned.

The task of manually loading many thousands of pins into a fixture is a tedious and costly operation. Each printed circuit has its own, unique pattern of test points, and a unique fixture must be provided for testing boards of each unique printed circuit. Often the printed circuit board carries printed patters or patterns of test points on both sides, and in such instances, two fixtures are required for double sided testing of those printed circuit boards. As a single fixture can contain as many as 10,000 pins, it is apparent that loading of the pins in the fixture is a very expensive and difficult task, and is a serious limitation on the automated testing of printed circuit boards.

Some manufacturers have attempted to automate the task of loading probes in a fixture by means of a pin loader comprising an x,y positioning table and pin inserting head. The x,y table moves each hole of the fixture between the pin-inserting head which inserts a pin. This is a sequential operation which is very time consuming. Other manufacturers have attempted to automate the task of loading pins into fixture holes using vibratory or shaker tables. In a conventional shaker table loading procedure, a fixture comprising two or more plates is placed on a shaker table; and, a plurality of pins are aligned and bundled together in a cassette, and placed with the pin bottom ends resting on the top plate of the fixture. The entire assembly is then vibrated to encourage the probes to seek holes in the plates and fall into their final positions. The leftover pins fall to the bottom of the apparatus, where they are collected, realigned, and combined with fresh pins and loaded into cassettes for loading in a new fixture. Collection and alignment of the pins is time-consuming.

OBJECTS OF THE INVENTION

It is an object of the invention to provide an improved shaker table automated test pin loading apparatus which overcomes the disadvantages of prior art shaker table automated test pin loading apparatus. Another object of the invention is to provide an improved shaker table test pin loading apparatus in which collection and alignment of leftover pins is facilitated.

Other objects and advantages of the present invention will be apparent from the following detailed description of the invention.

BRIEF SUMMARY OF THE INVENTION

The present invention provides an improved vibratory or shaker table automated pin loading apparatus, and comprising a novel chute and collection container in which extra pins are collected and automatically aligned for reloading in a cassette for subsequent loading in a new test fixture.

BRIEF DESCRIPTION OF THE DRAWINGS

The foregoing and other objects of the present invention will be achieved from the following detailed description of the invention, taken in combination with the accompanying drawings wherein like numerals depict like parts, and wherein.

DETAILED DESCRIPTION OF PREFERRED EMBODIMENT

Figure 1:
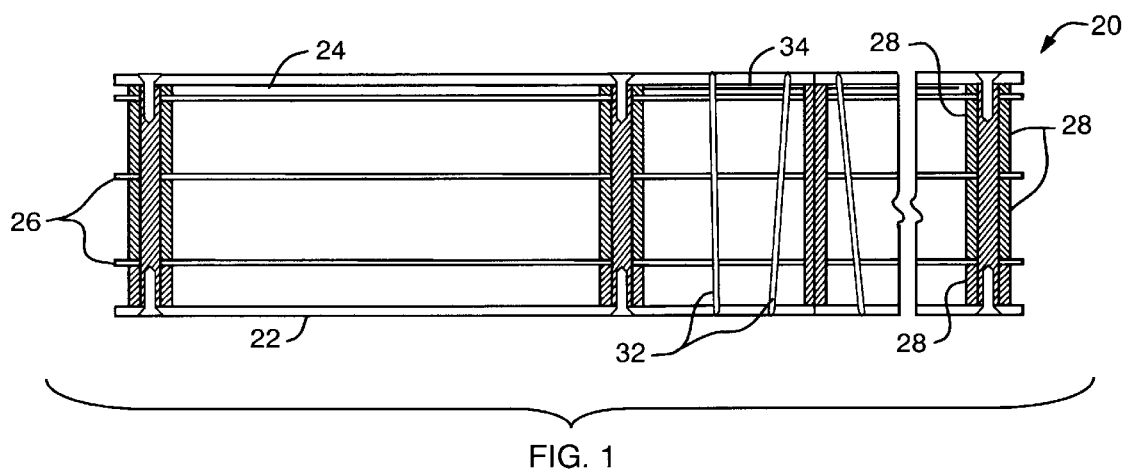
FIG. 1 is a side elevational view showing a typical test fixture for which the automated pin loading system of the present invention is useful.
Figure 2:
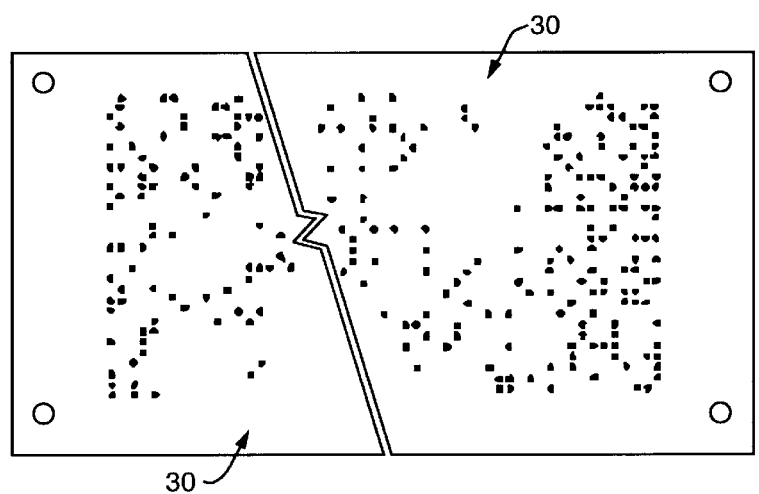
FIG. 2 is a top plan view of the test fixture of FIG. 1.
Figure 3:
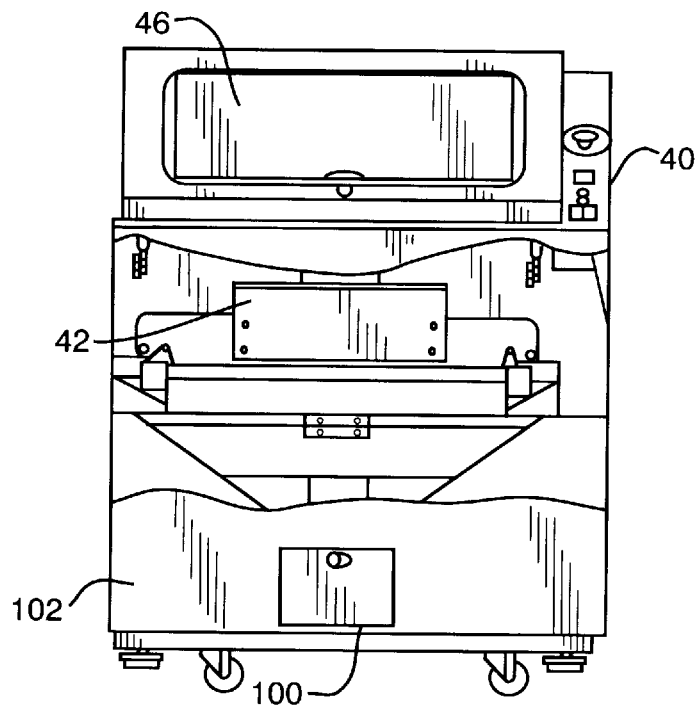
FIG. 3 is a front view, in partial cross section, showing an automated pin-loading apparatus in accordance with the present invention.
Figure 4:
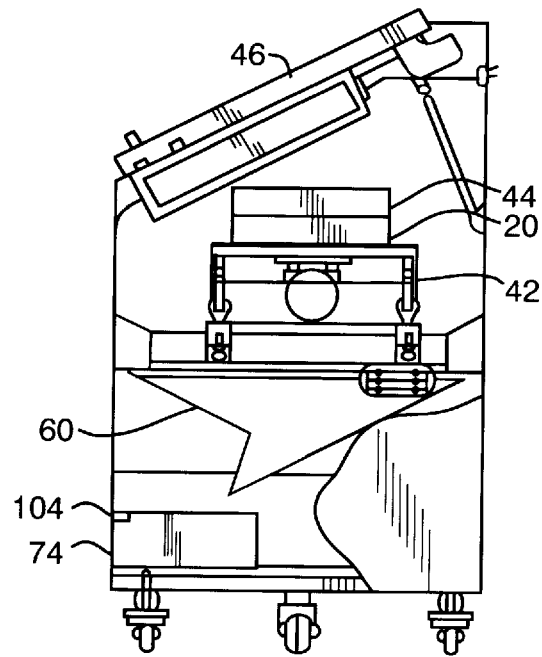
FIG. 4 is a side elevational view, in partial cross section of an automated pin loading apparatus in accordance with the present invention.
Figure 5:
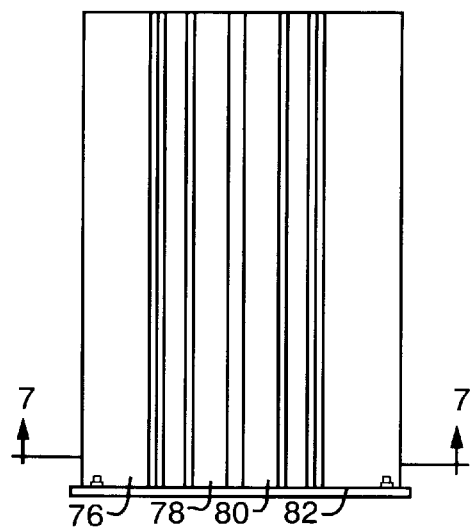
FIG. 5 is a top plan view of a pin drawer portion of the automated test pin loading apparatus of the invention.
Figure 6:
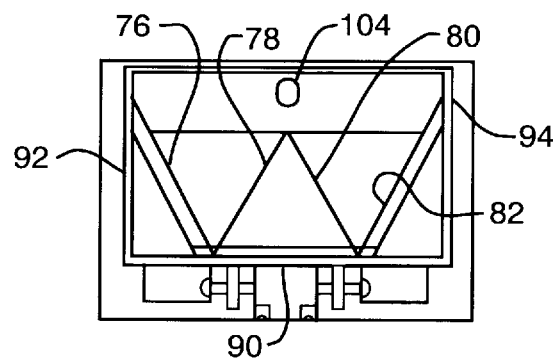
FIG. 6 is a side elevational view, in section, of the pin drawer of FIG. 5.
Figure 7:
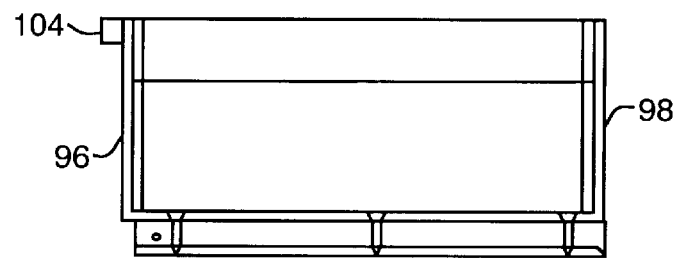
FIG. 7 is a cross-sectional view taken along 7—7 of the pin drawer of FIG. 5.
Figure 8:
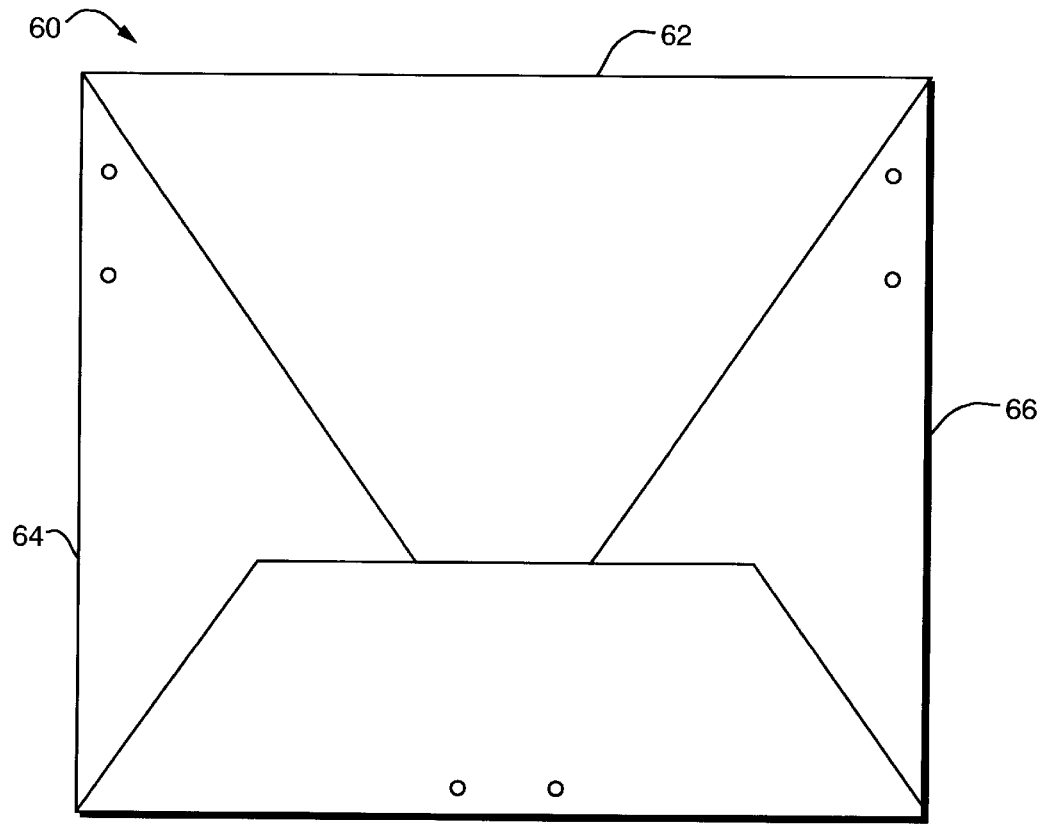
FIG. 8 is a top plan view of the chute portion of the present invention.
Figure 9:
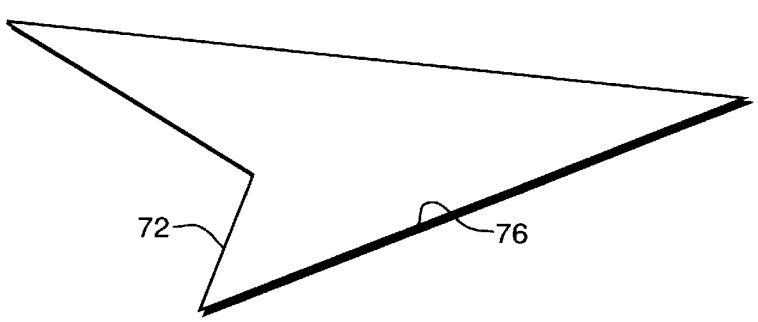
FIG. 9 is a side elevational view of the chute portion of the present invention.
Figure 10:
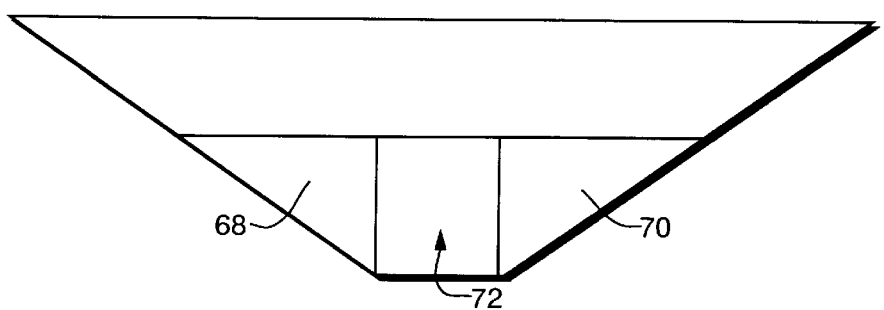
FIG. 10 is a front plan view of the chute portion of the present invention.

Referring to FIGS. 1 and 2, a typical test fixture 20 comprises an upper plate 24, a lower plate 22 and one or more intermediate plates 26 which are assembled in spaced apart relationship by a plurality of spacers 28. Plates 22, 24 and 26 are drilled with a grid pattern 30 for accommodating the thin wire pins or probes 32. Pins 32 are retained in fixture 20, for example, by means of a resiliently deformable retention sheet 34 or the like, as known in the art. Alternatively, pins 32 may be retained in fixture 20 by bulbous enlargement of a portion of the pins.

Referring now to FIGS. 3–10, an automated pin loading apparatus comprises a housing 40 having a vibrating deck or shaker table 42 mounted therein. Means such as an electromagnetic shaker driver assembly or motor-driven cammed shaker driver assembly (not shown) is mounted within housing 40 and mechanically attached to table 42. Upon excitation of the electromagnetic assembly or cammed motor, the shaker table or deck 42, vibrates in an x,y direction or x,y,z direction. The structure of housing 40, shaker table 42, shaker table mounting and shaker driver assembly are conventional.

Means (not shown) are provided for removably attaching fixture 20 and a pin cassette 44 to shaker table 42, for example, through a hinged access door 46 in housing 40.

During the vibratory operation, pins from the pin cassette 44 find and enter the holes 30 in upper plate 24 and subsequently pass through the aligned holes in plates 26 and 22. The vibratory operation also causes pins to scatter where they fall under the influence of gravity into the chute assembly 60 as described in detail hereinafter.

Following the vibratory loading action, the cassette 44 and fixture 20 are removed from the shaker table 42, and a freshly loaded cassette-fixture combination is affixed to the shaker table, and the operation repeated.

Referring in particular to FIGS. 5–10, a chute assembly 60 is positioned below shaker table 42 and extends from interior wall-to-wall of housing 40. Chute assembly 60 includes a downwardly disposed truncated back wall 62, downwardly disposed side walls 64 and 66 and front walls 68, 70 which together form a rectangular shaped funnel forming a ramped opening 72.

Chute 60 functions as a giant funnel, catching the pins as they fall from the shaker table, and funnels the pins into a pin collection container or drawer 74 as will be described in detail below. In order to insure that no pins become hung up in the chute, chute opening 72 should be wider than the longest pin. Also, walls 62, 64, 66 and 68 and floor 76 of chute 60 should be formed at an angle of at least about 40°–60° from the vertical in order to insure that no pins will get held up in the chute.

Pin collection container or drawer 74 comprises a rectangular container having a bottom wall 90, side walls 92, 94 and end walls 96, 98. Pin collection container or drawer 74 preferably is slidably mounted on drawer slides in an opening 100 in the front wall 102 of housing 40. A handle 104 is affixed to the drawer end wall 96 so as to facilitate opening of the collection container or drawer.

Pin collection container or drawer 74 has internal baffle walls 76, 78, 80, 82 which together form a "W" shaped hopper. Baffle walls 76, 78, 80, 82 are formed at an angle of at least about 40°–60° from the vertical so that pins dropping into the drawer will slide downwardly on the inclined surface and automatically align themselves within the hopper. In other words, loose pins dislodged from the shaker table fall onto chute 60 which acts as a giant funnel, funneling the pins into pin collection container or drawer 74. The pins fall onto the internal baffle walls 76, 78, 80, 82, where the slant of the walls orients the pins so that they all lie down in the same direction. Thus, rather than having a jumble of pins, all the pins run parallel to one another. This facilitates the removal of the pins for reloading into a cassette.

When pin collection container or drawer 74 is full, or between operations, the drawer is slid open, and the collected pins, which are all essentially aligned readily may be removed and loaded into a pin cassette.

It will thus be appreciated that the present invention provides an improvement over existing automated test pin shaker table loading apparatus in that it is no longer necessary to deal with a jumble of pins in the bottom of the shaker table test pin loading apparatus as was the case with the prior art apparatus. Rather, the pins are all neatly collected and aligned with one another and ready to reload into a cassette.

Figure 11A:
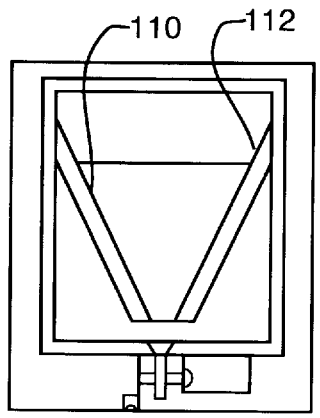
FIGS 11a and 11b are views similar to FIG. 6 of two alternative pin drawers made in accordance with the present invention.
Figure 11B:
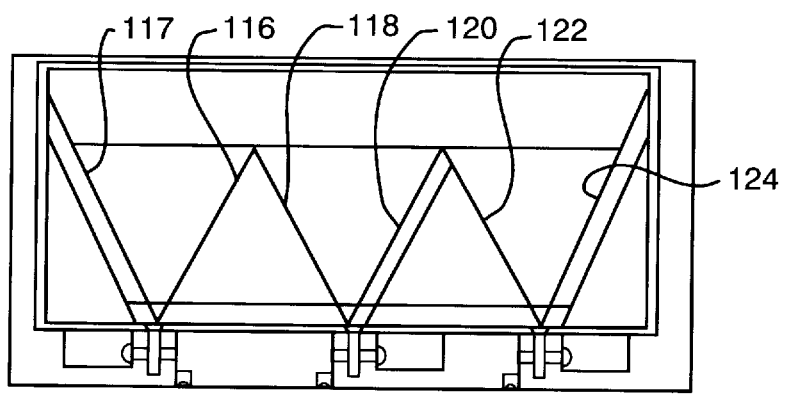

The invention is susceptible to modification. For example, as shown in FIGS. 11a and 11b, pin collection container or drawer 74 may have a single pair of baffle walls 110,112 forming a "V"-shaped hopper, or six (or more) baffle walls 114 . . . 124 forming a multiple—"V"-shaped hopper. Also, chute assembly 60 may take other shapes. For example, chute assembly 60 could be formed as a round funnel. Yet other changes may be made.

The invention has been described with reference to the illustrated and presently preferred embodiment. It is not intended that the invention be unduly limited by this disclosure, however. Instead, it is intended that the invention be defined only as set forth by the following claims.

I claim:

1. Apparatus for loading test pins into a test fixture having a plurality of holes to receive said test pins, comprising a shaker table for supporting a fixture to be loaded together with a pin cassette containing a plurality of pins with their bottom ends resting on the fixture, a funnel or chute located below the shaker table to catch spare pins and direct the pins into a collection container, wherein said collection container comprises one or more angled internal baffle walls for orienting the pins in the same direction.

2. Apparatus according to claim 1 wherein said funnel or chute comprises one or more downwardly directed walls angled at least about 40°–60° from the vertical.

3. Apparatus according to claim 1 wherein said collection container has at least one baffle wall angled at least about 40°–60° from the vertical.

4. Apparatus according to claim 1 wherein said collection container comprises two baffle walls forming a "V" in cross-section.

5. Apparatus according to claim 1 wherein said collection container comprises four internal baffle walls forming a "W" in cross-section.

6. Apparatus according to claim 1 wherein said collection container comprises a drawer which is slideably mounted below said chute.

* * * * *